United States Patent
Wang

Patent Number: 5,575,545
Date of Patent: Nov. 19, 1996

[54] MONITOR SHELL

[75] Inventor: Tsong L. Wang, Taoyuan Hsien, Taiwan

[73] Assignee: Shamrock Technology Company Limited, Taoyuan Hsien, Taiwan

[21] Appl. No.: 381,725

[22] Filed: Feb. 1, 1995

[51] Int. Cl.⁶ .................................................. A47B 81/06
[52] U.S. Cl. ...................... 312/7.2; 312/223.2; 361/682; 348/836; 348/843
[58] Field of Search ................................. 312/7.2, 223.1, 312/223.2; 348/787, 794, 836, 843; 361/681, 682; 248/222.11, 222.12

[56] References Cited

U.S. PATENT DOCUMENTS

| | | | |
|---|---|---|---|
| 4,063,289 | 12/1977 | Veenendaal | 348/836 |
| 4,853,790 | 8/1989 | Dickie | 348/836 |
| 5,033,802 | 7/1991 | Fairbanks | 348/836 |
| 5,122,928 | 6/1992 | Lo | 361/681 |
| 5,293,244 | 3/1994 | Kawaguchi | 348/787 |

*Primary Examiner*—Peter M. Cuomo
*Assistant Examiner*—Anthony D. Barfield
*Attorney, Agent, or Firm*—Schmeiser, Olsen & Watts

[57] ABSTRACT

A monitor shell includes a first frame and a second frame engageable with the first frame. The first frame includes a hollow rectangular panel, two vertical walls, a lower wall and an upper wall. Each of two receiving devices is formed on each vertical wall, and includes two fins and two blades projecting from each fin. Each of two barbs projects from each vertical wall. Two cylinders project from the hollow rectangular panel. Each of two brackets includes a first branch, a second branch projecting from the first branch, a third branch projecting from the second branch and an elastic branch projecting from the first branch. The first branch of each bracket includes a groove defined therein for receiving a board and a hole defined in an end portion thereof. The third branch of each bracket includes a U-shaped slot defined therein thus forming an elastic handle and a barb projecting from the elastic handle. Each cylinder is inserted into the hole defined in the first branch of each bracket while the third branch of each bracket is guided by means of the fins and blades of each receiving device. The barb formed on the third branch of each bracket is engageable with the barb formed on each vertical wall while the barb formed on the elastic branch of each bracket is engageable with each barb formed on the lower wall.

8 Claims, 5 Drawing Sheets

MONITOR SHELL

FIELD OF THE INVENTION

This invention relates to a monitor shell.

RELATED PRIOR ART

Manufacturers tend to produce monitors in greater sizes as customers tend progressively to demand more from monitors. That is, cathode-ray tubes contained in the monitors, circuit boards contained in the monitors and parts mounted on the circuit boards increase in size and weight as time goes by. A horizontal iron plate and two vertical iron plates are secured in such a monitor by means of a plurality of screws in order to install such a circuit board and parts in such a monitor. Installing the iron plates on the internal surface of the monitor shell involves much labor, therefore resulting in a high cost. The iron plates are heavy in weight, therefore causing much trouble in transporting such a monitor. As the parts are sheltered by means of the iron plates, one of the vertical iron plates has to be removed in order to check the parts, therefore causing much trouble in repairing such a monitor.

SUMMARY OF THE INVENTION

It is the primary objective of this invention to provide a monitor shell including a first frame and a second frame engageable with the first frame. The first frame includes a hollow rectangular panel, two vertical walls, an upper wall, a U-shaped lower wall and a tray projecting downwardly from the U-shaped lower wall. Each of two receiving devices is formed on each vertical wall, and includes two fins and two blades projecting from each fin. Each of two barbs projects from each vertical wall. Two cylinders project from a vertical wall of the tray of the first frame. Each of two brackets includes a first branch, a second branch projecting from the first branch, a third branch projecting from the second branch and an elastic branch projecting from the first branch. The first branch of each bracket defines a groove for receiving a circuit board and a hole. The third branch of each bracket includes a U-shaped slot defined therein thus forming an elastic handle and a barb projecting from the elastic handle. Each cylinder is inserted into the hole defined in the first branch of each bracket while the third branch of each bracket is guided by means of the fins and blades of each receiving device. The barb formed on the third branch of each bracket is engageable with the barb formed on each vertical wall while the barb formed on the elastic branch of each bracket is engageable with each barb formed on the lower wall.

DETAILED DESCRIPTION OF THE PREFERRED EMBODIMENT

Figure 1:
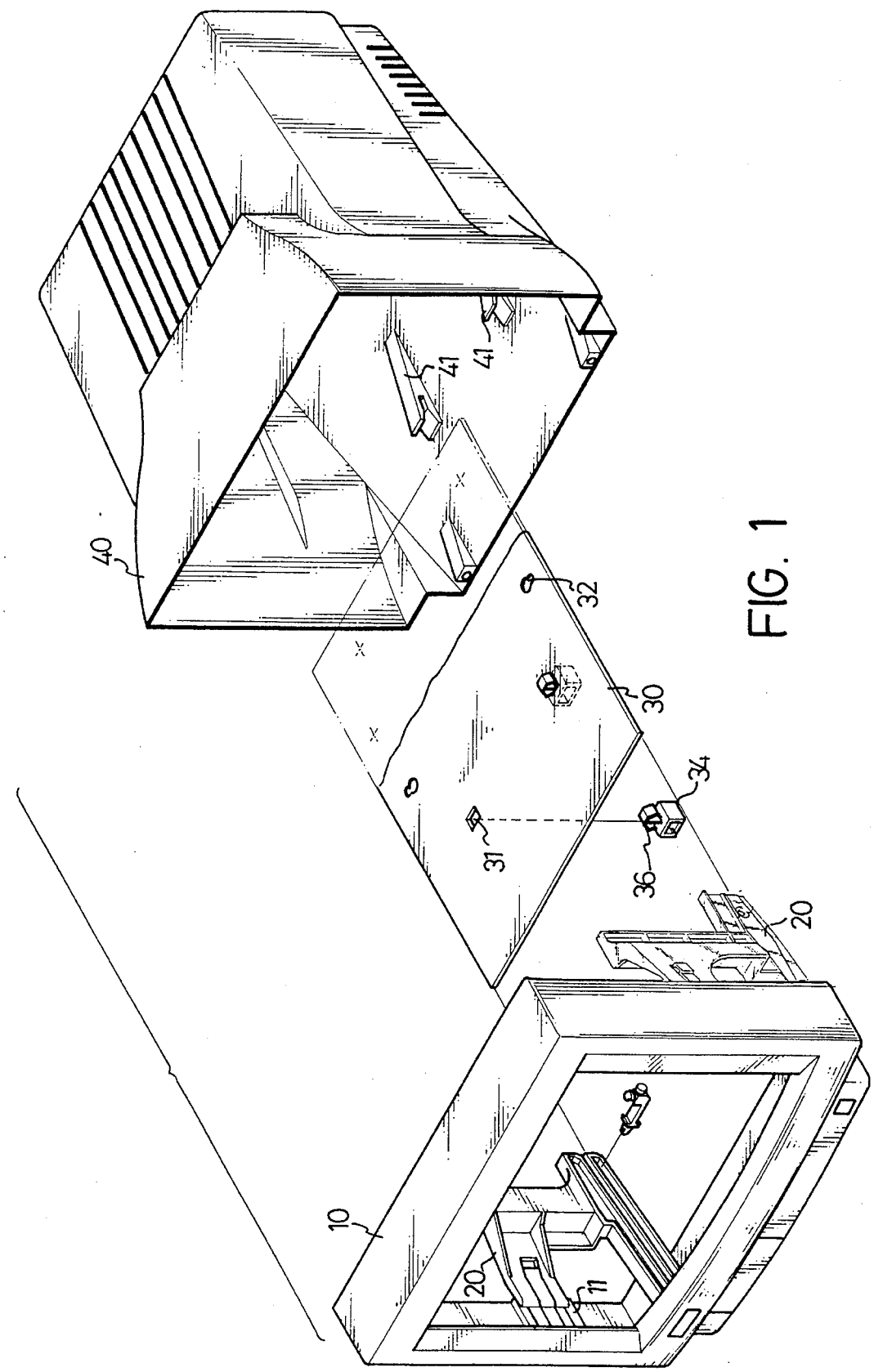
FIG. 1 is an isometric view of the preferred embodiment of a monitor shell according to this invention.

Referring to FIG. 1, a monitor includes a shell consisting of a first frame 10 and a second frame 40 engageable with the first frame 10. The first frame 10 can be secured to the second frame 40 by means of a number of screws (not shown).

A circuit board 30 can be mounted on the first frame 10 by means of two brackets 20. The circuit board 30 can be supported by means of two ribs 41 formed on an internal surface of the second frame 40. The circuit board 30 defines two apertures 31. There are two hollow pads 34 from each of which an anchor 36 projects upwardly. Each of the anchors 36 includes a stem and two elastic barbs projecting from the stem. Each of the anchors 36 is insertable through one of the apertures 31. The circuit board 30 is further supported by means of the hollow pads 34 which are located on the internal surface of the second frame 40.

Figure 2:
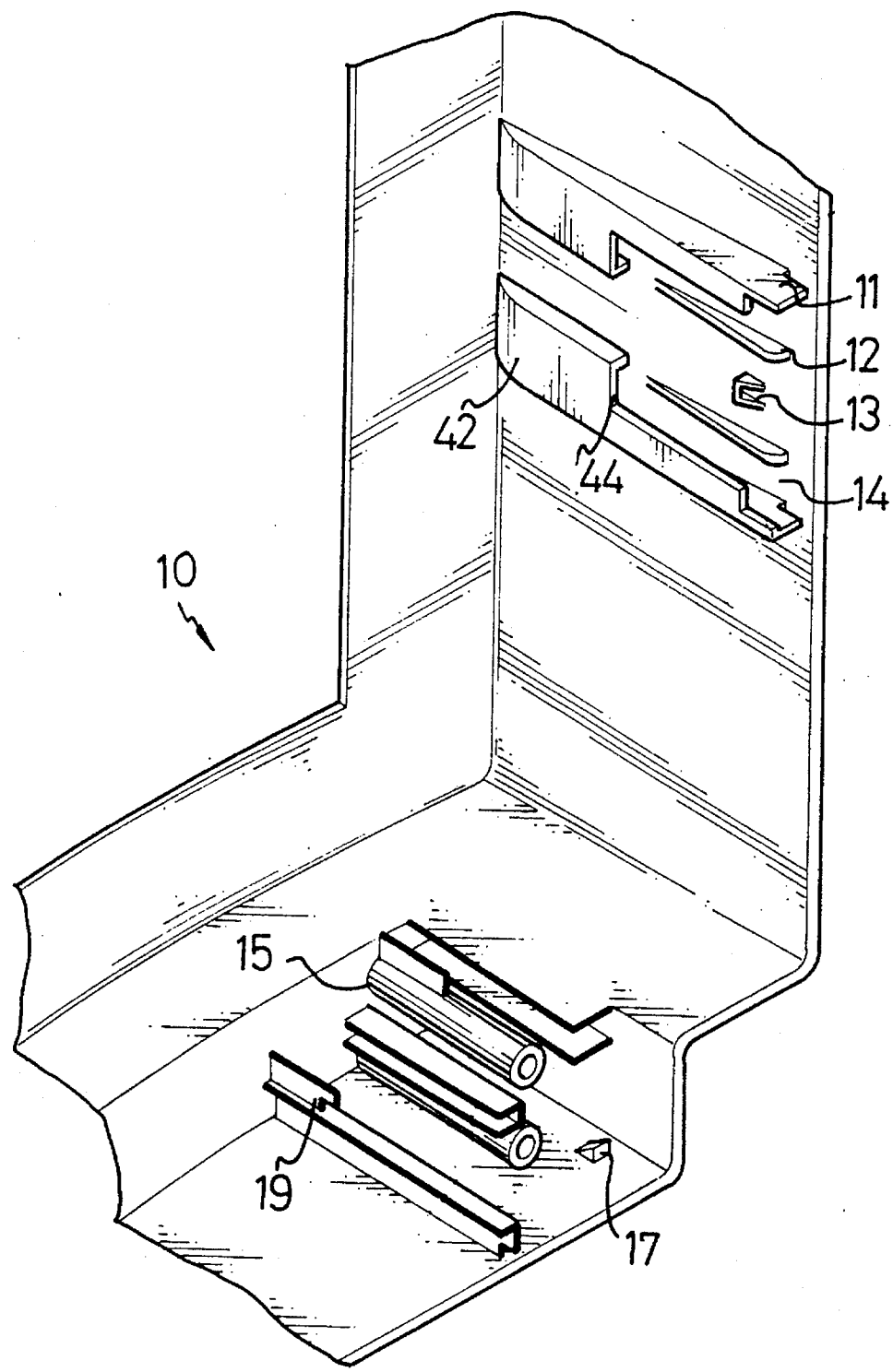
FIG. 2 is a partial view of a plurality of elements formed on an internal surface of a monitor shell as shown in FIG. 1.

Referring to FIGS. 1 and 2, the first frame 10 includes a hollow rectangular panel, an upper wall, two vertical walls, a U-shaped lower wall and a tray projecting downwardly from the U-shaped lower wall. Three branches of the U-shaped lower wall are formed together with three vertical walls of the tray.

Each of two receiving devices (only one is shown) is formed on a corresponding one of the vertical walls of the first frame 10. Each of the receiving devices includes two fins 11, two ribs 12, two blades 42 and a barb 13. The fins 11 project from an internal surface of the vertical wall of the first frame 10 parallel to each other. Each of the blades 42 projects perpendicularly from a corresponding one of the fins 11. Each of the blades 42 is in a stepped form including a stopping edge 44. The ribs 12 project from the internal surface of the vertical wall of the first frame 10 between the fins 11. A barb 13 is formed on the internal surface of the vertical wall of the first frame 10 between the ribs 12.

A second vertical wall of the first frame 10 is similar to the first vertical wall of the same in configuration and function, and therefore will not be described in detail.

A cylinder 15 and a tab 19 project horizontally from one of the vertical walls of the tray of the first frame 10 near the first vertical wall of the first frame 10. The tab 19 defines a cutout (not numbered). A barb 17 is formed on the lower wall of the first frame 10 near the first vertical wall of the same.

Another cylinder 15, another barb 17 and another tab 19 are formed near the second vertical wall of the first frame 10 although not shown in the drawings.

Figure 3:
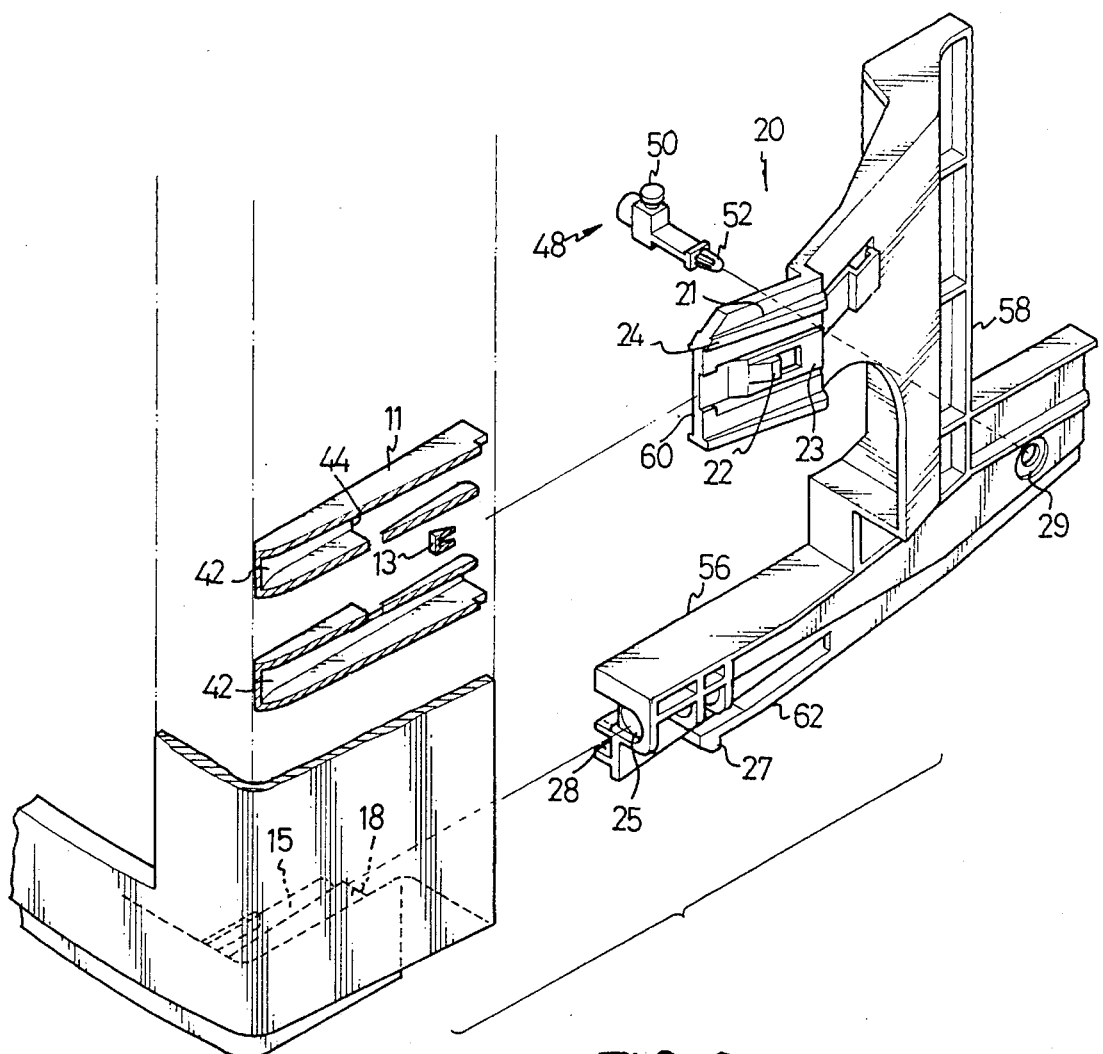
FIG. 3 is an isometric view of a bracket engageable with the element as shown in FIG. 2.

FIG. 3 shows in an enlarged scale a bracket 20 on the right-hand side in FIG. 1. The bracket 20 includes a first branch 56, a second branch 58 projecting upwardly from the first branch 56 thereof, a third branch 60 projecting horizontally from the second branch 58 and an elastic branch 62 formed below the first branch 56 thereof. A hole 25 is defined a first end portion of the first branch 56 of the bracket 20. A barb 27 is formed on a free end portion of the elastic branch 62 of the bracket 20.

A barb 22 is formed on an elastic handle 23 separated from the free end portion of the third branch 60 of the bracket 20 by means of a U-shaped slot (not numbered)

defined in the free end portion of the third branch 60 of the bracket 20. Two ribs 24 are formed on the free end portion of the third branch 60 of the bracket 20.

A groove 28 is defined in the first branch 56 of the bracket 20. An aperture 29 is defined in a second end portion of the first branch 56 of the bracket 20.

Figure 4:
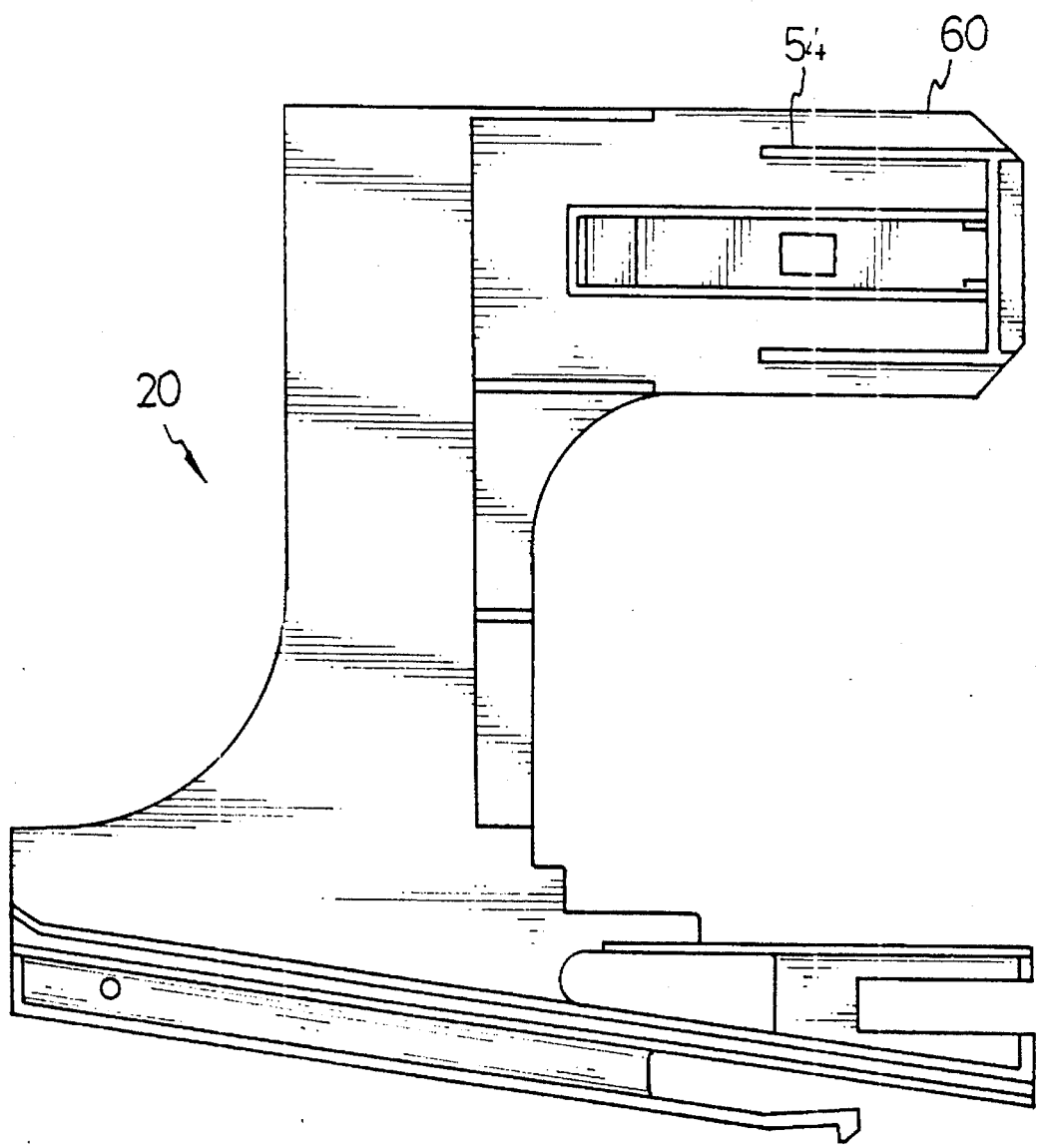
FIG. 4 is an opposite side view of the bracket as shown in FIG. 3.

Referring to FIG. 4, a ridge 54 extends as "U" on an opposite surface of the third branch 60 of the bracket 20.

There are two anchoring elements 48 for anchoring the circuit board 30 to the brackets 20. Each of the anchoring elements 48 includes a first anchor 50 and a second anchor 52 projecting perpendicularly from the first anchor 50. The first anchor 50 includes a neck and a head with a diameter greater than that of the neck. The second anchor 52 includes a stem and two elastic barbs projecting from a tip of the stem.

Referring to FIG. 1, the circuit board 30 defines two apertures 32. Each of the apertures 32 includes a large portion and a small portion.

Figure 5:
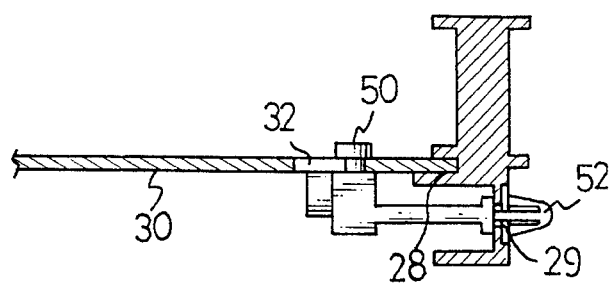
FIG. 5 is a horizontal cross-sectional partial view of the elements as shown in FIG. 3.

Referring to FIG. 5, each of two edges of the circuit board 30 is receivable in the groove 28 defined in a corresponding one of the brackets 20. The head of each of the first anchors 50 is insertable through the large portion of each of the apertures 32. The neck of each of the first anchors 50 is movable into the small portion of each of the apertures 32 while the elastic barbs of each of the second anchors 52 is insertable through the aperture 29 defined in a corresponding one of the brackets 20. Thus, the circuit board 30 is anchored to the brackets 20.

Referring to FIG. 3, each of the brackets 20 can be guided between the fins 11. The ribs 12 formed on the internal surface of each of the vertical walls Of the first frame 10 are slidable on the first surface of the third branch 60 of a corresponding one of the brackets 20 while the ribs 24 formed on the first surface of each of the brackets 20 are slidable on the internal surface of a corresponding one of the vertical walls of the first frame 10.

Referring to FIGS. 3 and 4, the ridge 54 can be guided between the blades 42, and can be restrained by means of the edges 44.

Figure 6:
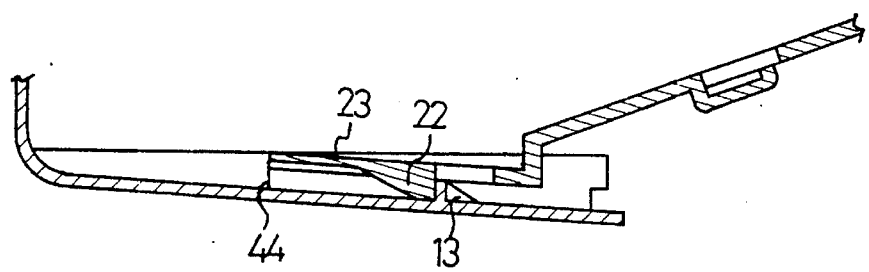
FIG. 6 is a vertical cross-sectional partial view of the elements as shown in FIG. 3.

Referring to FIG. 6, the barb 22 formed on each of the brackets 20 is engageable with the barb 13 formed on a corresponding one of the vertical walls of the first frame 10 in order to retain the brackets 20 on the first frame 10. The barbs 22 are disengageable from the barbs 13 by operating the handles 23.

Figure 7:
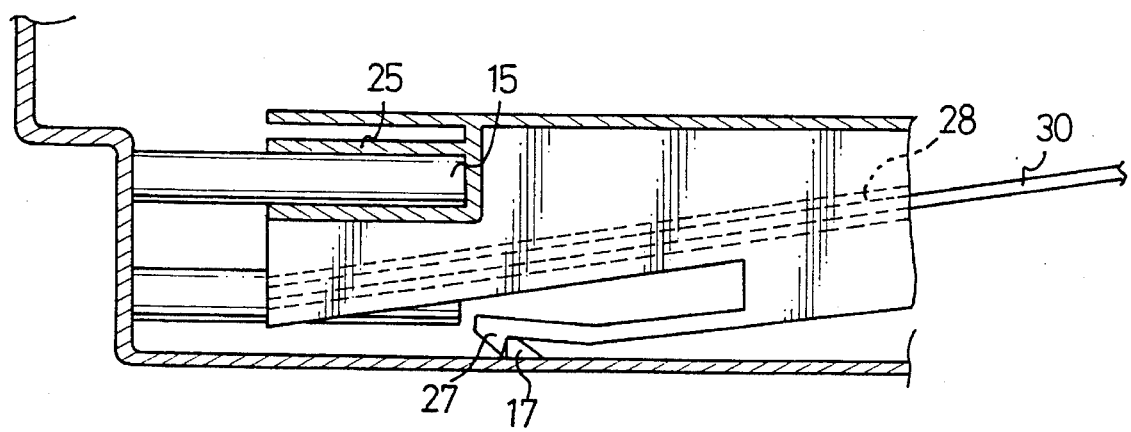
FIG. 7 is a vertical cross-sectional partial view of a circuit board mounted by means of an anchoring element on a bracket as shown in FIG. 3.

Referring to FIG. 7, each of the cylinders 15 is insertable into a corresponding one of the holes 25. Each of the barbs 27 is engageable with one of the barbs 17 in order to retain the brackets 20 on the first frame 10.

The preferred embodiment of this invention is described in detail for the purpose of illustration, not limitation. The scope of this invention is defined only by means of the appended claims.

What I claim as my invention is:

1. A monitor shell comprising:

a first frame including a hollow rectangular panel, two vertical walls, a lower wall and an upper wall;

a second frame engageable with the first frame;

two receiving devices each formed on a corresponding one of the vertical walls, each of the receiving devices including two fins and two blades projecting perpendicularly from a corresponding one of the fins;

two first barbs each projecting from a corresponding one of the vertical walls;

two second barbs formed on the lower wall;

two cylinders projecting horizontally from the rectangular panel of the first frame;

two brackets each including;
   a first branch including a first end portion, a second end portion, a groove defined therein for receiving a board and a hole defined longitudinally in the first end portion thereof;

a second branch projecting perpendicularly from the first branch;

a third branch projecting perpendicularly from the second branch and including a free end portion, a U-shaped slot defined therein thus forming an elastic handle and a third barb projecting from the elastic handle;

a fourth branch extending from the first branch and including a fourth barb projecting therefrom;

wherein each of the cylinders is inserted into the hole defined in the first branch of each of the brackets while the third branch of each of the brackets is guided by means of the fins and blades of each of the receiving devices;

wherein the third barb formed on the third branch of each of the brackets is engageable with the second barb formed on each of the vertical walls while the fourth barb formed on the fourth branch of each of the brackets is engageable with each of the second barbs formed on the lower walls.

2. A monitor shell according to claim 1 including two anchoring elements each for anchoring the board to a corresponding one of the brackets.

3. A monitor shell according to claim 2 wherein each of the anchoring elements includes a first branch for anchoring the board and a second branch for anchoring a corresponding one of the brackets.

4. A monitor shell according to claim 3 wherein each of the anchoring elements includes a first anchor formed on the first branch thereof wherein the first anchor includes a neck and a head.

5. A monitor shell according to claim 4 including a board wherein the board defines two apertures each including a large portion and a small portion, wherein the head of the first anchor of each of the anchoring elements is insertable through the large portion of each of the apertures defined in the board and the neck of the first anchor of each of the anchoring elements is receivable in the small portion of each of the apertures defined in the board.

6. A monitor shell according to claim 3 wherein each of the anchoring elements includes a second anchor protruding from the second branch thereof wherein the second anchor includes a stem and two elastic barbs projecting from the stem.

7. A monitor shell according to claim 6 wherein the second anchor of each of the anchoring elements includes a stem and two elastic barbs projecting from a tip of the stem.

8. A monitor shell according to claim 7 wherein the second end portion of the first branch of each of the brackets defines an aperture, so that the elastic barbs of the second anchor of each of the anchoring elements are insertable through the aperture defined in the second end portion of the first branch of each of the brackets.

\* \* \* \* \*